(12) United States Patent  
Hsieh et al.

(10) Patent No.: US 8,963,297 B2
(45) Date of Patent: Feb. 24, 2015

(54) SEMICONDUCTOR APPARATUS

(71) Applicant: Phostek, Inc., Hsinchu (TW)

(72) Inventors: Yen-Chang Hsieh, Hsinchu (TW); Jinn Kong Sheu, Tainan (TW); Heng Liu, Sunnyvale, CA (US); Chun-Chao Li, Taoyuan County (TW); Ya-Hsuan Shih, Changhua County (TW); Chia-Nan Chen, Hsinchu County (TW)

(73) Assignee: Phostek, Inc., Hsinchu (TW)

( * ) Notice: Subject to any disclaimer, the term of this patent is extended or adjusted under 35 U.S.C. 154(b) by 42 days.

(21) Appl. No.: 13/678,646

(22) Filed: Nov. 16, 2012

(65) Prior Publication Data

US 2013/0175674 A1 Jul. 11, 2013

(30) Foreign Application Priority Data

Jan. 6, 2012 (TW) .............................. 101100736 A
Jul. 19, 2012 (TW) .............................. 101126113 A

(51) Int. Cl.
*H01L 21/02* (2006.01)
*H01L 29/36* (2006.01)
*H01L 31/076* (2012.01)
*H01L 25/075* (2006.01)
*H01L 33/08* (2010.01)

(52) U.S. Cl.
CPC ............. *H01L 29/36* (2013.01); *H01L 25/0753* (2013.01); *H01L 33/08* (2013.01); *H01L 31/076* (2013.01)
USPC ........................................................ 257/655

(58) Field of Classification Search
USPC ................................. 257/13, 79–103, 918, 257/E51.018–E51.022, E33.001–E33.077, 257/E33.054, E25.028, E25.032; 438/22–47, 493, 503, 507, 956
See application file for complete search history.

(56) References Cited

U.S. PATENT DOCUMENTS 6,822,991 B2   11/2004   Collins, III et al.
6,878,975 B2   4/2005    Hueschen (Continued)

FOREIGN PATENT DOCUMENTS

TW   201117402 A   5/2011
TW   201133587 A   10/2011

OTHER PUBLICATIONS

Chang, Jih-Yuan et al. "Numerical Investigation on the Enhanced Carrier Collection Efficiency of Ga-face GaN/InGaN p-i-n Solar Cells with Polarization Compensation Interlayers." Optics Letters, vol. 36, No. 17, Sep. 1, 2011. pp. 3500-3502.

*Primary Examiner* — Dao H Nguyen
*Assistant Examiner* — Tram H Nguyen
(74) *Attorney, Agent, or Firm* — Huffman Law Group, PC

(57) ABSTRACT

A semiconductor apparatus includes a p-type doped layer, an n-type doped layer, and an internal electrical connection layer that is deposited and electrically coupled between the p-type doped layer and the n-type doped layer. In one embodiment, the internal electrical connection layer includes a group IV element and a nitrogen element, and the number of atoms of the group IV element and the nitrogen element is greater than 50% of the total number of atoms in the internal electrical connection layer. In another embodiment, the internal electrical connection layer includes carbon element with a concentration greater than $10^{17}$ atoms/cm$^3$. In a further embodiment, the internal electrical connection layer is formed at a temperature lower than those of the p-type doped layer and the n-type doped layer.

49 Claims, 4 Drawing Sheets

(56) References Cited

U.S. PATENT DOCUMENTS

| | | | |
|---|---|---|---|
| 8,525,203 B2* | 9/2013 | Tachibana et al. | 257/98 |
| 2008/0179587 A1* | 7/2008 | Namkoong et al. | 257/13 |
| 2008/0303018 A1* | 12/2008 | Kim et al. | 257/13 |
| 2010/0269896 A1 | 10/2010 | Sheng et al. | |
| 2011/0198561 A1 | 8/2011 | Tachibana et al. | |
| 2011/0204376 A1 | 8/2011 | Su et al. | |
| 2012/0012814 A1* | 1/2012 | Harada et al. | 257/13 |

* cited by examiner

SEMICONDUCTOR APPARATUS

BACKGROUND OF THE INVENTION

1. Field of the Invention

The present invention generally relates to a semiconductor apparatus, and more particularly to a semiconductor apparatus with an internal electrical connection layer.

2. Description of Related Art

One common technique of increasing luminescence efficiency of a light-emitting diode (LED) is to use a tunnel junction to stack two or more LEDs. The stacked LEDs emit more light and are brighter than a single LED. The tunnel junction also enhances current spreading, which allows more carriers to perform recombination. Furthermore, stacked LEDs have fewer electrodes than individual LEDs yielding the same amount of light, therefore saving space and reducing electromigration associated with the electrodes.

One conventional method of forming a tunnel junction is to employ a heavy doping technique, for example, as disclosed in U.S. Pat. No. 6,822,991 entitled "Light Emitting Devices Including Tunnel Junctions." As the tunnel distance of a tunnel junction is usually small, it is difficult to achieve a desired tunnel junction by the heavy doping technique. Moreover, heavy doping may disadvantageously affect the doping concentration of a neighboring layer.

Another conventional method of forming a tunnel junction is to employ a polarization technique, for example, as disclosed in U.S. Pat. No. 6,878,975 entitled "Polarization Field Enhanced Tunnel Structures." The polarization technique, however, requires complex process control and unduly limits fabrication material selection.

The problems described above may occur in other semiconductor devices such as solar cells or diodes, and thus a need has arisen for a novel semiconductor apparatus to alleviate the noted problems.

SUMMARY OF THE INVENTION

In view of the foregoing, an embodiment of the present invention provides a semiconductor apparatus with an internal electrical connection layer to enhance operating efficiency of the semiconductor apparatus.

According to one embodiment, a semiconductor apparatus includes a p-type doped layer, an n-type doped layer, and an internal electrical connection layer that is deposited and electrically coupled between the p-type doped layer and the n-type doped layer. In one embodiment, the internal electrical connection layer includes a group IV element and a nitrogen element, and the number of atoms of the group IV element and the nitrogen element is greater than 50% of the total number of atoms in the internal electrical connection layer. In another embodiment, the internal electrical connection layer includes a carbon element with a concentration greater than $10^{17}$ atoms/cm$^3$. In a further embodiment, the internal electrical connection layer is formed at a temperature lower than those of the p-type doped layer and the n-type doped layer.

DETAILED DESCRIPTION OF THE INVENTION

Figure 1A:
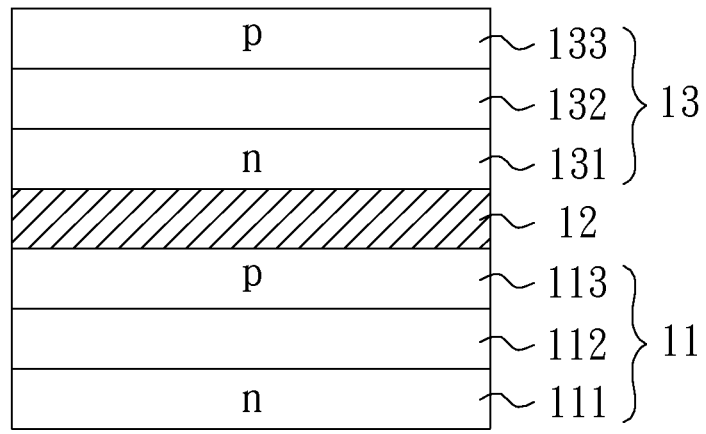
FIG. 1A shows a cross section of a semiconductor apparatus according to a first embodiment of the present invention.

FIG. 1A shows a cross section of a semiconductor apparatus 100 according to a first embodiment of the present invention. For clarity, only elements that are pertinent to the embodiment are shown. The embodiment may be widely adapted to a variety of semiconductor apparatuses such as semiconductor light-emitting devices (e.g., light-emitting diodes), photodetectors, solar cells, transistors, or diodes (e.g., laser diodes).

As shown in FIG. 1A, a first semiconductor device 11 is formed. The first semiconductor device 11 includes, from bottom to top, an n-type doped layer 111, an intermediate layer 112, and a p-type doped layer 113. Taking a light-emitting diode (LED) as an example, the intermediate layer 112 is a light-emitting layer. Taking a solar cell as an example, the intermediate layer 112 is a light-absorbing layer. In the specification, a p-type and an n-type may be called a first-type and a second-type, respectively; the p-type and the n-type may alternatively be called a second-type and a first-type, respectively. In an exemplary embodiment, carbon may be used as a doping source while forming the p-type doped layer 113, such that the p-type doped layer 113 may include a carbon element with a concentration greater than $10^{17}$ atoms/cm$^3$, preferably $10^{18}$-$10^{21}$ atoms/cm$^3$. The p-type doped layer 113 may also include a group III nitride. In another exemplary embodiment, the p-type doped layer 113 has a p-dopant concentration of $10^{18}$-$10^{21}$ atoms/cm$^3$.

Next, an internal electrical connection layer 12 is formed above the p-type doped layer 113. The internal electrical connection layer 12 may be formed by using chemical vapor deposition, physical vapor deposition, or implantation technique. According to one aspect of the first embodiment, a mixture comprising a group IV-based precursor (e.g., carbon-based precursor) and a nitrogen-based precursor is used while forming the internal electrical connection layer 12, such that the internal electrical connection layer 12 may include a group IV element (e.g., carbon, silicon or germanium) and nitrogen, where the number of atoms of the IV element and nitrogen is greater than 50% of the total number of atoms in the internal electrical connection layer 12.

The internal electrical connection layer 12 of the embodiment may also include magnesium with a concentration greater than $10^{17}$ atoms/cm$^3$, preferably $10^{19}$-$10^{22}$ atoms/cm$^3$. In one embodiment, a group III-based precursor is not used while forming the internal electrical connection layer 12, such that the internal electrical connection layer 12 does not include a group III element (e.g., aluminum, gallium, or indium).

The internal electrical connection layer 12 may be a discontinuous layer such as an island-shaped layer. The internal electrical connection layer 12 may be a non-single crystal layer. The internal electrical connection layer 12 has a thickness less than or equal to 100 nanometers.

Next, as shown in FIG. 1A, a second semiconductor device 13 is formed above the internal electrical connection layer 12. The second semiconductor device 13 includes, from bottom to top, an n-type doped layer 131, an intermediate layer 132, and a p-type doped layer 133. Accordingly, the internal electrical connection layer 12 is deposited between the p-type doped layer 113 and the n-type doped layer 131 to electrically couple with the p-type doped layer 113 and the n-type doped layer 131. In an exemplary embodiment, a number of semiconductor devices are stacked by layering a number of internal electrical connection layers 12.

In an exemplary embodiment, carbon may be used as a doping source while forming the n-type doped layer 131, such that the n-type doped layer 131 may include a carbon element with a concentration greater than $10^{17}$ atoms/cm$^3$, preferably $10^{18}$-$10^{21}$ atoms/cm$^3$. The n-type doped layer 131 may also include a group III nitride. In another exemplary embodiment, the n-type doped layer 131 has an n-dopant concentration of $10^{18}$-$10^{21}$ atoms/cm$^3$.

According to the semiconductor apparatus 100 of the embodiment, the p-n junction formed by the p-type doped layer 113 and the n-type doped layer 131 is reversely driven to obtain a reverse voltage drop less than or equal to 1 volt. In the embodiment, the n-type doped layer 111 and the intermediate layer 112 may be used as a base structure for the p-type doped layer 113, or a further base structure (not shown) may be formed below the n-type doped layer 111.

In an application example of the embodiment, the internal electrical connection layer 12 acts as a defect-induced internal electrical connection layer to provide a first defect density with respect to a second defect density at a (bottom) growth surface of the defect-induced internal electrical connection layer 12. The first defect density may be at least five times the second defect density, and the defect-induced internal electrical connection layer 12 has a thickness less than or equal to 100 nanometers.

Figure 1B:
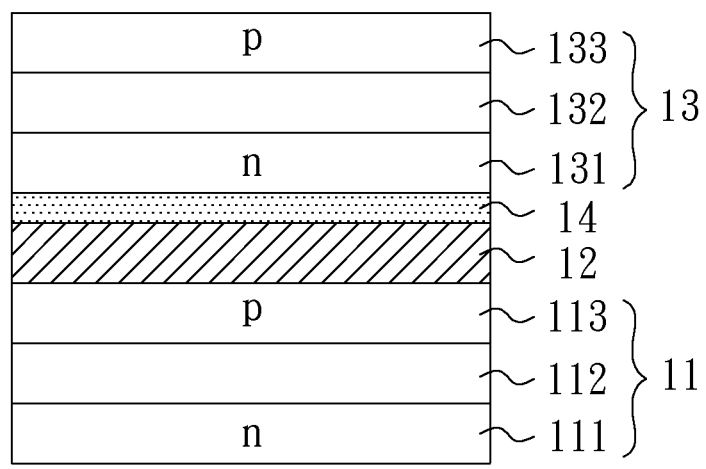
FIG. 1B shows a cross section of another semiconductor apparatus according to a first embodiment of the present invention.

In the embodiment, as shown in a semiconductor apparatus 101 of FIG. 1B, a defect reduction layer 14 may be further formed between the defect-induced internal electrical connection layer 12 and the n-type doped layer 131 to provide a third defect density with respect to a forth defect density at a (bottom) growth surface of the defect reduction layer 14. The third defect density may be less than one fifth of the fourth defect density, and the defect reduction layer 14 has a thickness more than or equal to 10 nanometers.

Figure 4A:
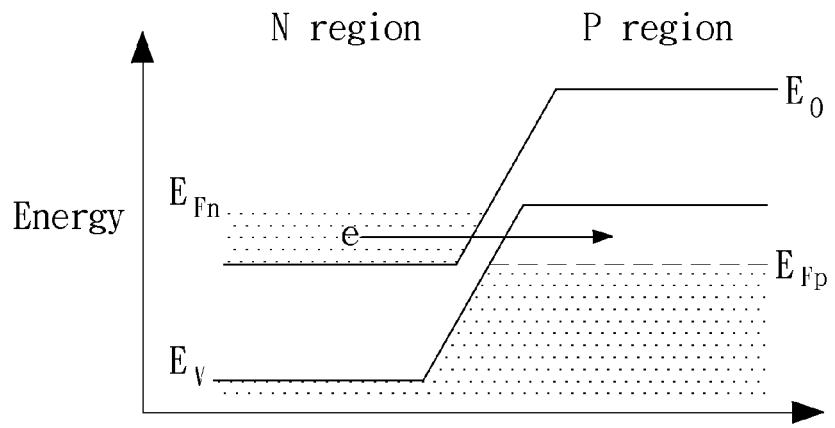
FIG. 4A to FIG. 4C show various tunneling schemes.
Figure 4B:
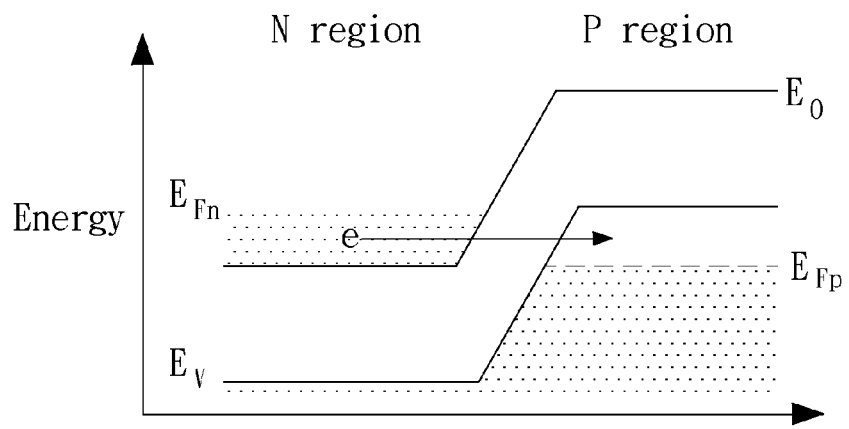

When the defect-induced internal electrical connection layer 12 is used as a tunnel junction layer between the p-type doped layer 113 and the n-type doped layer 131, the tunnel junction layer performs one of the following tunneling schemes. In one tunneling scheme, the defect-induced internal electrical connection layer 12 performs Fowler-Nordheim tunneling (F-N tunneling) as shown in FIG. 4A. Compared to direct tunneling as shown in FIG. 4B, the F-N tunneling occurs because of significant differences between lattice constants of junction materials that cause band bending to substantially reduce bandgap distance of the charge tunnel, thereby generating F-N tunnel current.

Figure 4C:
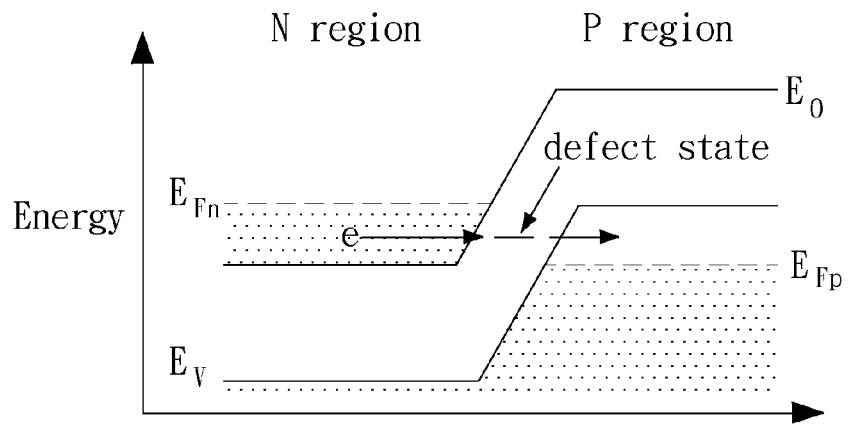

In another tunneling scheme, the defect-induced internal electrical connection layer 12 performs Frenkel-Poole Emission tunneling (F-P tunneling) as shown in FIG. 4C. High dielectric-coefficient material (e.g., silicon nitride) commonly includes high-density trap medium, which generates excess temporary energy levels. Carriers such as electron-hole pairs entering into silicon nitride due to thermal ionization or other means may be trapped by the trap medium. When an electric field is applied to a dielectric layer, thermal ionization assisted by the electric field may arouse the trapped electron-hole pairs to a conduction band or a valence band such that the electron-hole pairs may flow. The aroused carriers may be iteratively aroused and trapped many times such that the carriers may flow across the dielectric layer to result in a tunnel current. In the F-P tunneling scheme, the amount of defect determines the quantity of the tunnel current.

Figure 2A:
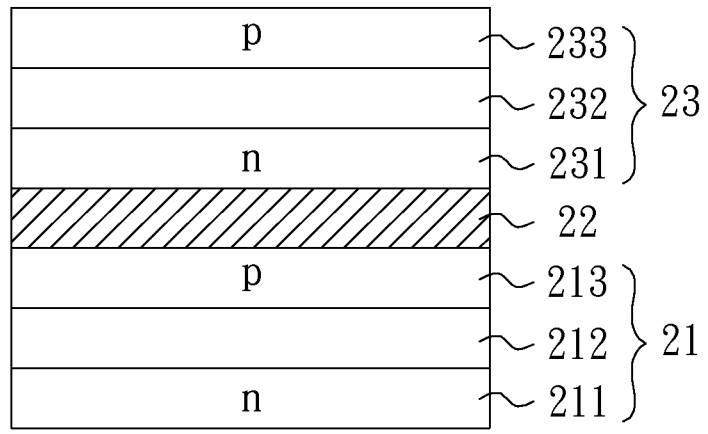
FIG. 2A shows a cross section of a semiconductor apparatus according to a second embodiment of the present invention.

FIG. 2A shows a cross section of a semiconductor apparatus 200 according to a second embodiment of the present invention. For clarity, only elements that are pertinent to the embodiment are shown. The embodiment may be widely adapted to a variety of semiconductor apparatuses such as semiconductor light-emitting devices (e.g., light-emitting diodes), photodetectors, solar cells, transistors, or diodes (e.g., laser diodes).

As shown in FIG. 2A, a first semiconductor device 21 is formed. The first semiconductor device 21 includes, from bottom to top, an n-type doped layer 211, an intermediate layer 212, and a p-type doped layer 213. Taking a light-emitting diode (LED) as an example, the intermediate layer 212 is a light-emitting layer. Taking a solar cell as an example, the intermediate layer 212 is a light-absorbing layer. In the specification, a p-type and an n-type may be called a first-type and a second-type, respectively; the p-type and the n-type may alternatively be called a second-type and a first-type, respectively. In an exemplary embodiment, carbon may be used as a doping source while forming the p-type doped layer 213, such that the p-type doped layer 213 may include a carbon element with a concentration greater than $10^{17}$ atoms/cm$^3$, preferably $10^{18}$-$10^{21}$ atoms/cm$^3$. The p-type doped layer 213 may also include a group III nitride. In another exemplary embodiment, the p-type doped layer 213 has a p-dopant concentration of $10^{18}$-$10^{21}$ atoms/cm$^3$.

Next, an internal electrical connection layer 22 is formed above the p-type doped layer 213. The internal electrical connection layer 22 may be formed by using chemical vapor deposition, physical vapor deposition, or implantation technique. According to one aspect of the second embodiment, carbon may be used as a doping source while forming the internal electrical connection layer 22, such that the internal electrical connection layer 22 may include carbon with a concentration greater than $10^{17}$ atoms/cm$^3$, preferably $10^{18}$-$10^{20}$ atoms/cm$^3$.

In the embodiment, a mixture comprising a group IV-based precursor (e.g., carbon-based precursor) and a nitrogen-based precursor is used while forming the internal electrical connection layer 22, such that the internal electrical connection layer 22 may include a group IV element (e.g., carbon, silicon, or germanium) and nitrogen, where the number of atoms of the group IV element and nitrogen is greater than 50% of the total number of atoms in the internal electrical connection layer 12.

The internal electrical connection layer 22 of the embodiment may also include magnesium with a concentration greater than $10^{17}$ atoms/cm$^3$, preferably $10^{19}$-$10^{22}$ atoms/cm$^3$. In one embodiment, a group III-based precursor is not used while forming the internal electrical connection layer 22, such that the internal electrical connection layer 22 does not include a group III element (e.g., aluminum, gallium, or indium).

In the embodiment, the internal electrical connection layer 22 may be a discontinuous layer such as an island-shaped layer. The internal electrical connection layer 22 may be a non-single crystal layer. The internal electrical connection layer 22 has a thickness less than or equal to 100 nanometers.

Next, as shown in FIG. 2A, a second semiconductor device 23 is formed above the internal electrical connection layer 22. The second semiconductor device 23 includes, from bottom to top, an n-type doped layer 231, an intermediate layer 232, and a p-type doped layer 233. Accordingly, the internal electrical connection layer 22 is deposited between the p-type doped layer 213 and the n-type doped layer 231 to electrically couple with the p-type doped layer 213 and the n-type doped layer 231. In an exemplary embodiment, a number of semiconductor devices are stacked by layering a number of internal electrical connection layers 22.

In an exemplary embodiment, carbon may be used as a doping source while forming the n-type doped layer 231, such that the n-type doped layer 231 may include a carbon element with a concentration greater than $10^{17}$ atoms/cm$^3$, preferably $10^{18}$-$10^{21}$ atoms/cm$^3$. The n-type doped layer 231 may also include a group III nitride. In another exemplary embodiment, the n-type doped layer 231 has an n-dopant concentration of $10^{18}$-$10^{21}$ atoms/cm$^3$.

According to the semiconductor apparatus 200 of the embodiment, the p-n junction formed by the p-type doped layer 213 and the n-type doped layer 231 is reversely driven to obtain a reverse voltage drop less than or equal to 1 volt. In the embodiment, the n-type doped layer 211 and the intermediate layer 212 may be used as a base structure for the p-type doped layer 213, or a further base structure (not shown) may be formed below the n-type doped layer 211.

In an application example of the embodiment, the internal electrical connection layer 22 acts as a defect-induced internal electrical connection layer to provide a first defect density with respect to a second defect density at a (bottom) growth surface of the defect-induced internal electrical connection layer 22. The first defect density may be at least five times the second defect density, and the defect-induced internal electrical connection layer 22 has a thickness less than or equal to 100 nanometers.

Figure 2B:
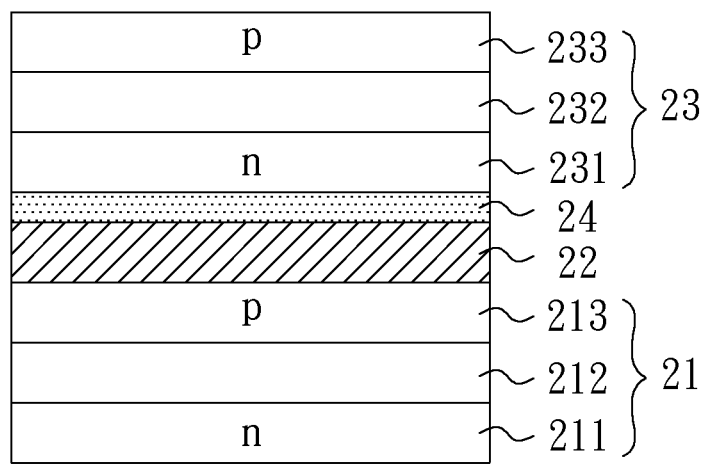
FIG. 2B shows a cross section of another semiconductor apparatus according to a second embodiment of the present invention.

In the embodiment, as shown in a semiconductor apparatus 201 of FIG. 2B, a defect reduction layer 24 may be further formed between the defect-induced internal electrical connection layer 22 and the n-type doped layer 231 to provide a third defect density with respect to a forth defect density at a (bottom) growth surface of the defect reduction layer 24. The third defect density may be less than one fifth of the fourth defect density, and the defect reduction layer 24 has a thickness more than or equal to 10 nanometers. When the defect-induced internal electrical connection layer 22 is used as a tunnel junction layer between the p-type doped layer 213 and the n-type doped layer 231, the tunnel junction layer performs one of the tunneling schemes as discussed above concerning the first embodiment.

Figure 3A:
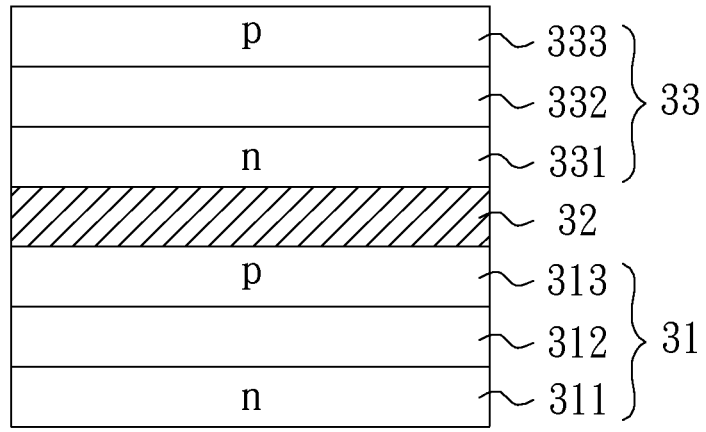
FIG. 3A shows a cross section of a semiconductor apparatus according to a third embodiment of the present invention.

FIG. 3A shows a cross section of a semiconductor apparatus 300 according to a third embodiment of the present invention. Only elements that are pertinent to the embodiment are shown. The embodiment may be widely adapted to a variety of semiconductor apparatuses such as semiconductor light-emitting devices (e.g., light-emitting diodes), photodetectors, solar cells, transistors, or diodes (e.g., laser diodes).

As shown in FIG. 3A, a first semiconductor device 31 is formed. The first semiconductor device 31 includes, from bottom to top, an n-type doped layer 311, an intermediate layer 312, and a p-type doped layer 313. Taking a light-emitting diode (LED) as an example, the intermediate layer 312 is a light-emitting layer. Taking a solar cell as an example, the intermediate layer 312 is a light-absorbing layer. In the specification, a p-type and an n-type may be called a first-type and a second-type, respectively; the p-type and the n-type may alternatively be called a second-type and a first-type, respectively. In an exemplary embodiment, carbon may be used as a doping source while forming the p-type doped layer 313, such that the p-type doped layer 313 may include a carbon element with a concentration greater than $10^{17}$ atoms/cm$^3$, preferably $10^{18}$-$10^{21}$ atoms/cm$^3$. The p-type doped layer 313 may also include a group III nitride. In another exemplary embodiment, the p-type doped layer 313 has a p-dopant concentration of $10^{18}$-$10^{21}$ atoms/cm$^3$.

According to one aspect of the third embodiment, a low-temperature internal electrical connection layer 32 is formed, at a first temperature, between the p-type doped layer 313 and an n-type doped layer 331 to electrically couple with the p-type doped layer 313 and the n-type doped layer 331. The first temperature may be 400-1000° C. In the embodiment, the term "low-temperature" may indicate that the low-temperature internal electrical connection layer 32 is formed at a temperature lower than a temperature at which the p-type doped layer 313 is formed, and lower than a temperature at which the n-type doped layer 331 is formed.

Carbon may be used as a doping source while forming the internal electrical connection layer 32, such that the internal electrical connection layer 32 may include carbon with a concentration greater than $10^{17}$ atoms/cm$^3$, preferably $10^{18}$-$10^{20}$ atoms/cm$^3$.

In the embodiment, a mixture comprising a group IV-based precursor (e.g., carbon-based precursor) and a nitrogen-based precursor is used while forming the internal electrical connection layer 32, such that the internal electrical connection layer 32 may include a group IV element (e.g., carbon, silicon or germanium) and nitrogen, wherein the number of atoms of the IV element and nitrogen is greater than 50% of the total number of atoms in the internal electrical connection layer 32.

The internal electrical connection layer 32 of the embodiment may also include magnesium with a concentration greater than $10^{17}$ atoms/cm$^3$, preferably $10^{19}$-$10^{22}$ atoms/cm$^3$. In one embodiment, a group III-based precursor is not used while forming the internal electrical connection layer 32, such that the internal electrical connection layer 32 does not include a group III element (e.g., aluminum, gallium or indium).

The internal electrical connection layer 32 may be a discontinuous layer such as an island-shaped layer. The internal electrical connection layer 32 may be a non-single crystal layer. The internal electrical connection layer 32 has a thickness less than or equal to 100 nanometers.

Next, as shown in FIG. 3A, a second semiconductor device 33 is formed above the internal electrical connection layer 32. The second semiconductor device 33 includes, from bottom to top, the n-type doped layer 331, an intermediate layer 332, and a p-type doped layer 333. Accordingly, the internal electrical connection layer 32 is deposited between the p-type doped layer 313 and the n-type doped layer 331 to electrically couple with the p-type doped layer 313 and the n-type doped layer 331. In an exemplary embodiment, a number of semiconductor devices are stacked by layering a number of internal electrical connection layers 32.

In an exemplary embodiment, carbon may be used as a doping source while forming the n-type doped layer 331, such that the n-type doped layer 331 may include a carbon element with a concentration greater than $10^{17}$ atoms/cm$^3$, preferably $10^{18}$-$10^{21}$ atoms/cm$^3$. The n-type doped layer 331 may also include a group III nitride. In another exemplary embodiment, the n-type doped layer 331 has an n-dopant concentration of $10^{18}$-$10^{21}$ atoms/cm$^3$.

According to the semiconductor apparatus 300 of the embodiment, the p-n junction formed by the p-type doped layer 313 and the n-type doped layer 331 is reversely driven to obtain a reverse voltage drop less than or equal to 1 volt. In the embodiment, the n-type doped layer 311 and the intermediate layer 312 may be used as a base structure for the p-type doped layer 313, or a further base structure (not shown) may be formed below the n-type doped layer 311.

In an application example of the embodiment, the internal electrical connection layer 32 acts as a defect-induced internal electrical connection layer to provide a first defect density with respect to a second defect density at a (bottom) growth surface of the defect-induced internal electrical connection layer 32. The first defect density may be at least five times the second defect density, and the defect-induced internal electrical connection layer 32 has a thickness less than or equal to 100 nanometers.

Figure 3B:
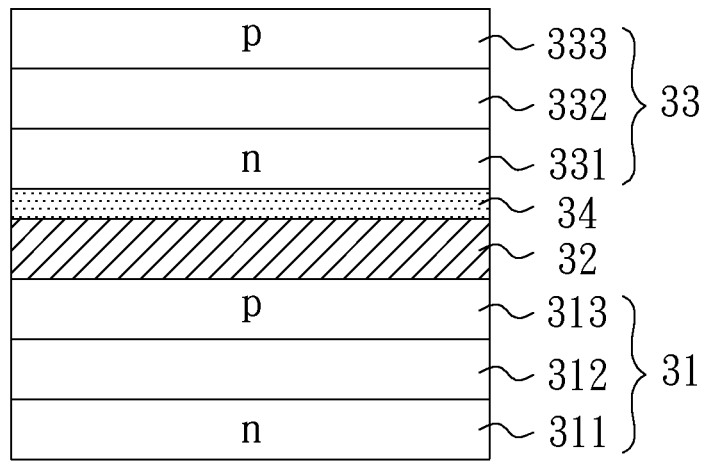
FIG. 3B shows a cross section of another semiconductor apparatus according to a third embodiment of the present invention.

As shown in a semiconductor apparatus 301 of FIG. 3B, a defect reduction layer 34 may be further formed between the defect-induced internal electrical connection layer 32 and the n-type doped layer 331 to provide a third defect density with respect to a forth defect density at a (bottom) growth surface of the defect reduction layer 34. The third defect density may be less than one fifth of the fourth defect density, and the defect reduction layer 34 has a thickness more than or equal to 10 nanometers. When the defect-induced internal electrical connection layer 32 is used as a tunnel junction layer between the p-type doped layer 313 and the n-type doped layer 331, the tunnel junction layer performs one of the tunneling schemes as discussed above concerning the first embodiment.

In the embodiment, the low-temperature internal electrical connection layer 32 may include oxide, nitride, silicide, oxynitride, carbonitride, carbide, carbon, silicon, metal, or a combination thereof. For example, the low-temperature internal electrical connection layer 32 may include silicon oxide, silicon nitride, magnesium nitride, gallium nitride, aluminum nitride, indium nitride, silicon oxynitride, silicon carbide, aluminum, gallium, or a combination thereof.

The low-temperature internal electrical connection layer 32 of the embodiment may include metal-based compound that is non-stoichiometric with excess metal element (e.g., magnesium, aluminum, gallium, or indium). The metal-based compound mentioned above may include metal oxide, metal nitride, metal oxynitride, or metal carbide.

In addition to a layer made of metal-based compound, the low-temperature internal electrical connection layer 32 may also include a layer made of oxide, nitride, silicide, oxynitride, carbonitride, carbide, carbon, silicon, or metal.

Although specific embodiments have been illustrated and described, it will be appreciated by those skilled in the art that various modifications may be made without departing from the scope of the present invention, which is intended to be limited solely by the appended claims.

What is claimed is:

1. A semiconductor apparatus, comprising:
   a p-type doped layer;
   an n-type doped layer; and
   an internal electrical connection layer deposited between the p-type doped layer and the n-type doped layer, and electrically coupled between the p-type doped layer and the n-type doped layer;
   wherein the internal electrical connection layer includes a group IV element and a nitrogen element, and the number of atoms of the group IV element and the nitrogen element is greater than 50% of the total number of atoms in the internal electrical connection layer;
   wherein the internal electrical connection layer is a defect-induced internal electrical connection layer, which provides a first defect density with respect to a second defect density at a growth surface of the defect-induced internal electrical connection layer, the first defect density being at least five times the second defect density, and the defect-induced internal electrical connection layer having a thickness less than or equal to 100 nanometers.

2. The apparatus of claim 1, wherein a reverse voltage drop is less than or equal to 1 volt when the p-n junction formed by the p-type doped layer and the n-type doped layer is reversely driven.

3. The apparatus of claim 1, wherein the internal electrical connection layer further comprises a carbon element with a concentration greater than $10^{17}$ atoms/cm$^3$.

4. The apparatus of claim 1, wherein the p-type doped layer comprises a carbon element with a concentration greater than $10^{17}$ atoms/cm$^3$.

5. The apparatus of claim 1, wherein the n-type doped layer comprises a carbon element with a concentration greater than $10^{17}$ atoms/cm$^3$.

6. The apparatus of claim 1, wherein the internal electrical connection layer further comprises magnesium with a concentration greater than $10^{17}$ atoms/cm$^3$.

7. The apparatus of claim 1, wherein the internal electrical connection layer does not comprise a group III element.

8. The apparatus of claim 1, wherein the internal electrical connection layer has a thickness less than or equal to 100 nanometers.

9. The apparatus of claim 1, wherein the p-type doped layer has a p-dopant concentration of $10^{18}$-$10^{21}$ atoms/cm$^3$.

10. The apparatus of claim 1, wherein the n-type doped layer has an n-dopant concentration of $10^{18}$-$10^{21}$ atoms/cm$^3$.

11. The apparatus of claim 1 comprising at least two semiconductor devices, wherein the p-type doped layer is deposited in one of the semiconductor devices, the n-type doped layer is deposited in another of the semiconductor devices, and the internal electrical connection layer is deposited between two of the semiconductor devices to electrically couple said two semiconductor devices, and the p-type doped layer and the n-type doped layer include a group III nitride.

12. The apparatus of claim 11, wherein the semiconductor device is a light-emitting diode, a photodetector, a solar cell, a transistor, a diode, or a laser diode.

13. The apparatus of claim 1, wherein the internal electrical connection layer is a discontinuous layer.

14. The apparatus of claim 1, wherein the internal electrical connection layer is a non-single crystal layer.

15. A semiconductor apparatus, comprising:
    a p-type doped layer;
    an n-type doped layer; and
    an internal electrical connection layer deposited between the p-type doped layer and the n-type doped layer, and electrically coupled between the p-type doped layer and the n-type doped layer;
    wherein the internal electrical connection layer includes a carbon element with a concentration greater than $10^{17}$ atoms/cm$^3$;
    wherein the internal electrical connection layer is a defect-induced internal electrical connection layer, which provides a first defect density with respect to a second defect density at a growth surface of the defect-induced internal electrical connection layer, the first defect density being at least five times the second defect density, and the defect-induced internal electrical connection layer having a thickness less than or equal to 100 nanometers.

16. The apparatus of claim 15, wherein a reverse voltage drop is less than or equal to 1 volt when the p-n junction formed by the p-type doped layer and the n-type doped layer is reversely driven.

17. The apparatus of claim 15, wherein the p-type doped layer comprises a carbon element with a concentration greater than $10^{17}$ atoms/cm$^3$.

18. The apparatus of claim 15, wherein the n-type doped layer comprises a carbon element with a concentration greater than $10^{17}$ atoms/cm$^3$.

19. The apparatus of claim 15, wherein the internal electrical connection layer further comprises magnesium with a concentration greater than $10^{17}$ atoms/cm$^3$.

20. The apparatus of claim 15, wherein the internal electrical connection layer does not comprise a group III element.

21. The apparatus of claim 15, wherein the internal electrical connection layer has a thickness less than or equal to 100 nanometers.

22. The apparatus of claim 15, wherein the p-type doped layer has a p-dopant concentration of $10^{18}$-$10^{21}$ atoms/cm$^3$.

23. The apparatus of claim 15, wherein the n-type doped layer has an n-dopant concentration of $10^{18}$-$10^{21}$ atoms/cm$^3$.

24. The apparatus of claim 15 comprises at least two semiconductor devices, wherein the p-type doped layer is deposited in one of the semiconductor devices, the n-type doped layer is deposited in another of the semiconductor devices, and the internal electrical connection layer is deposited between two of the semiconductor devices to electrically couple said two semiconductor devices, and the p-type doped layer and the n-type doped layer include a group III nitride.

25. The apparatus of claim 24, wherein the semiconductor device is a light-emitting diode, a photodetector, a solar cell, a transistor, a diode, or a laser diode.

26. The apparatus of claim 15, wherein the internal electrical connection layer is a discontinuous layer.

27. The apparatus of claim 15, wherein the internal electrical connection layer is a non-single crystal layer.

28. The apparatus of claim 15, wherein the internal electrical connection layer includes a group IV element and a nitrogen element, and the number of atoms of the group IV element and the nitrogen element is greater than 50% of the total number of atoms in the internal electrical connection layer.

29. A semiconductor apparatus, comprising:
a p-type doped layer;
an n-type doped layer; and
a low-temperature internal electrical connection layer deposited between the p-type doped layer and the n-type doped layer, and electrically coupled between the p-type doped layer and the n-type doped layer;
wherein the low-temperature internal electrical connection layer is formed at a temperature lower than a temperature at which the p-type doped layer is formed, and lower than a temperature at which the n-type doped layer is formed;
wherein the internal electrical connection layer is a defect-induced internal electrical connection layer, which provides a first defect density with respect to a second defect density at a growth surface of the defect-induced internal electrical connection layer, the first defect density being at least five times the second defect density, and the defect-induced internal electrical connection layer having a thickness less than or equal to 100 nanometers.

30. The apparatus of claim 29, wherein a reverse voltage drop is less than or equal to 1 volt when the p-n junction formed by the p-type doped layer and the n-type doped layer is reversely driven.

31. The apparatus of claim 29, wherein the internal electrical connection layer further comprises a carbon element with a concentration greater than $10^{17}$ atoms/cm$^3$.

32. The apparatus of claim 29, wherein the p-type doped layer comprises a carbon element with a concentration greater than $10^{17}$ atoms/cm$^3$.

33. The apparatus of claim 29, wherein the n-type doped layer comprises a carbon element with a concentration greater than $10^{17}$ atoms/cm$^3$.

34. The apparatus of claim 29, wherein the internal electrical connection layer further comprises magnesium with a concentration greater than $10^{17}$ atoms/cm$^3$.

35. The apparatus of claim 29, wherein the internal electrical connection layer does not comprise a group III element.

36. The apparatus of claim 29, wherein the internal electrical connection layer has a thickness less than or equal to 100 nanometers.

37. The apparatus of claim 29, wherein the p-type doped layer has a p-dopant concentration of $10^{18}$-$10^{21}$ atoms/cm$^3$.

38. The apparatus of claim 29, wherein the n-type doped layer has an n-dopant concentration of $10^{18}$-$10^{21}$ atoms/cm$^3$.

39. The apparatus of claim 29 comprises at least two semiconductor devices, wherein the p-type doped layer is deposited in one of the semiconductor devices, the n-type doped layer is deposited in another of the semiconductor devices, and the internal electrical connection layer is deposited between two of the semiconductor devices to electrically couple said two semiconductor devices, and the p-type doped layer and the n-type doped layer include group III nitride.

40. The apparatus of claim 39, wherein the semiconductor device is a light-emitting diode, a photodetector, a solar cell, a transistor, a diode, or a laser diode.

41. The apparatus of claim 29, wherein the internal electrical connection layer is a discontinuous layer.

42. The apparatus of claim 29, wherein the internal electrical connection layer is a non-single crystal layer.

43. The apparatus of claim 29, wherein the low-temperature internal electrical connection layer comprises oxide, nitride, silicide, oxynitride, carbonitride, carbide, carbon, silicon, metal, or a combination thereof.

44. The apparatus of claim 29, wherein the low-temperature internal electrical connection layer comprises a metal-based compound that is non-stoichiometric with an excess metal element.

45. The apparatus of claim 44, wherein the low-temperature internal electrical connection layer further comprises a layer made of oxide, nitride, silicide, oxynitride, carbonitride, carbide, carbon, silicon, metal, or a combination thereof.

46. The apparatus of claim 29, wherein the internal electrical connection layer includes a group IV element and a nitrogen element, and the number of atoms of the group IV element and the nitrogen element is greater than 50% of the total number of atoms in the internal electrical connection layer.

47. A semiconductor apparatus, comprising:
a p-type doped layer;
an n-type doped layer;
an internal electrical connection layer deposited between the p-type doped layer and the n-type doped layer, and electrically coupled between the p-type doped layer and the n-type doped layer; and
at least two semiconductor devices, wherein the p-type doped layer is deposited in one of the semiconductor devices, the n-type doped layer is deposited in another of the semiconductor devices, and the internal electrical connection layer is deposited between two of the semiconductor devices to electrically couple said two semiconductor devices, and the p-type doped layer and the n-type doped layer include a group III nitride;

wherein the internal electrical connection layer includes a group IV element and a nitrogen element, and the number of atoms of the group IV element and the nitrogen element is greater than 50% of the total number of atoms in the internal electrical connection layer.

48. A semiconductor apparatus, comprising:
a p-type doped layer;
an n-type doped layer;
an internal electrical connection layer deposited between the p-type doped layer and the n-type doped layer, and electrically coupled between the p-type doped layer and the n-type doped layer; and
at least two semiconductor devices, wherein the p-type doped layer is deposited in one of the semiconductor devices, the n-type doped layer is deposited in another of the semiconductor devices, and the internal electrical connection layer is deposited between two of the semiconductor devices to electrically couple said two semiconductor devices, and the p-type doped layer and the n-type doped layer include a group III nitride;
wherein the internal electrical connection layer includes a carbon element with a concentration greater than $10^{17}$ atoms/cm$^3$.

49. A semiconductor apparatus, comprising:
a p-type doped layer;
an n-type doped layer;
a low-temperature internal electrical connection layer deposited between the p-type doped layer and the n-type doped layer, and electrically coupled between the p-type doped layer and the n-type doped layer; and
at least two semiconductor devices, wherein the p-type doped layer is deposited in one of the semiconductor devices, the n-type doped layer is deposited in another of the semiconductor devices, and the internal electrical connection layer is deposited between two of the semiconductor devices to electrically couple said two semiconductor devices, and the p-type doped layer and the n-type doped layer include group III nitride;
wherein the low-temperature internal electrical connection layer is formed at a temperature lower than a temperature at which the p-type doped layer is formed, and lower than a temperature at which the n-type doped layer is formed.

* * * * *